(12) United States Patent
Ventzek et al.

(10) Patent No.: US 11,545,364 B2
(45) Date of Patent: Jan. 3, 2023

(54) PULSED CAPACITIVELY COUPLED PLASMA PROCESSES

(71) Applicant: Tokyo Electron Limited, Tokyo (JP)

(72) Inventors: Peter Ventzek, Austin, TX (US); Alok Ranjan, Austin, TX (US); Kensuke Taniguchi, Miyagi (JP); Shinya Morikita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/001,327

(22) Filed: Aug. 24, 2020

(65) Prior Publication Data

US 2022/0059358 A1    Feb. 24, 2022

(51) Int. Cl.
*H01J 37/32*  (2006.01)
*H01L 21/3065*  (2006.01)
*H01L 21/311*  (2006.01)
*H05H 1/46*  (2006.01)

(52) U.S. Cl.
CPC .... *H01L 21/3065* (2013.01); *H01J 37/32091* (2013.01); *H01J 37/32183* (2013.01); *H01L 21/31116* (2013.01); *H05H 1/46* (2013.01); *H01J 2237/334* (2013.01)

(58) Field of Classification Search
CPC ........... H01L 21/3065; H01L 21/31116; H01L 21/31138; H01J 37/32091; H01J 37/32183; H01J 2237/334; H05H 1/46
USPC ....... 438/706, 710, 712, 714, 717, 719, 723, 438/736; 156/345.4, 345.44
See application file for complete search history.

(56) References Cited

U.S. PATENT DOCUMENTS

| 9,123,509 B2 | 9/2015 | Papasouliotis et al. |
| 2015/0072530 A1* | 3/2015 | Kim ................... H01J 37/32091 438/703 |
| 2015/0348763 A1* | 12/2015 | Mori ................. H01L 21/31116 156/345.26 |
| 2017/0092468 A1* | 3/2017 | Shiina ............... H01L 29/66795 |

(Continued)

FOREIGN PATENT DOCUMENTS

| JP | 2018535504 A | 11/2018 |
| KR | 20170054282 A | 5/2017 |

OTHER PUBLICATIONS

Butterbaugh, J.W., et al., "Plasma-surface interactions in fluorocarbon etching of silicon dioxide," Journal of Vacuum Science and Technology B9 (3), May/Jun. 1991, 11 pages.

(Continued)

*Primary Examiner* — Lan Vinh
(74) *Attorney, Agent, or Firm* — Slater Matsil, LLP

(57) ABSTRACT

A method includes performing a first on phase including applying an SP pulse to an SP electrode to generate plasma, performing a second on phase after the first on phase, performing a corner etch phase after the second on phase, and performing a by-product management phase after the corner etch phase. The SP pulse terminates at the end of the first on phase. The second on phase includes applying a first BP pulse to a BP electrode coupled to a target substrate. The first BP pulse includes a first BP power level and accelerates ions of the plasma toward to target substrate. The corner etch phase includes applying a BP spike including a second BP power level greater than the first BP power level. The duration of the BP spike is less than the duration of the first BP pulse.

20 Claims, 9 Drawing Sheets

(56) References Cited

U.S. PATENT DOCUMENTS

| | | |
|---|---|---|
| 2017/0099722 A1 | 4/2017 | Kawasaki et al. |
| 2017/0125260 A1 | 5/2017 | Tan et al. |
| 2020/0058470 A1 | 2/2020 | Ventzek et al. |
| 2020/0090948 A1 | 3/2020 | Yanagawa et al. |

OTHER PUBLICATIONS

Kwon, Ohseung, et al., "Surface kinetics modeling of silicon and silicon oxide plasma etching," Journal of Vacuum Science and Technology A24(5), Sep./Oct. 2006, 8 pages.

International Search Report and Written Opinion, PCT Application No. PCT/US2021/039051, dated Oct. 20, 2021, 12 pages.

\* cited by examiner

PULSED CAPACITIVELY COUPLED PLASMA PROCESSES

TECHNICAL FIELD

The present invention relates generally to plasma processing, and, in particular embodiments, to systems and methods for plasma processing using capacitively coupled plasma and pulsed power.

BACKGROUND

Device fabrication within microelectronic workpieces may involve a series of manufacturing techniques including formation, patterning, and removal of a number of layers of material on a substrate. Many such techniques require high aspect ratios such as high aspect ratio etches (e.g. memory etches for NAND fabrication), high aspect ratio contact (HARC) etches (e.g. for logic contacts), as well as other back end of line (BEOL) etches.

Modern semiconductor device fabrication processes seek to push high aspect ratio processes for even greater limits. For example, attempting to meet strict tilt, aspect ratio, and ellipticity requirements, methods utilizing low temperature, tailored waveforms, and/or synchronous power (i.e. source power and bias power on simultaneously) combined with very high source power and bias power have been employed.

Capacitively coupled plasma (CCP) systems may be used for high aspect ratio processes. Higher power and voltage, additional frequencies, and lower processing temperatures may all desirable to improve process control, but add considerable complexity to the CCP system. Therefore, more agile hardware enables precision control of flux, energy, and chemistry during plasma processing without employing while achieving lower complexity may be desirable.

SUMMARY

In accordance with an embodiment of the invention, a method of plasma etching includes performing a first on phase including applying a source power (SP) pulse to an SP electrode to generate plasma in a plasma processing chamber, performing a second on phase after the first on phase, performing a corner etch phase after the second on phase, and performing a by-product management phase after the corner etch phase. The SP pulse includes a first SP power level and terminates at the end of the first on phase. The second on phase includes applying a first bias power (BP) pulse to a BP electrode coupled to a target substrate within the plasma processing chamber. The first BP pulse includes a first BP power level and accelerates ions of the plasma toward to target substrate to etch a recess in an etchable material of the target substrate. The corner etch phase includes applying a BP spike including a second BP power level greater than the first BP power level. The duration of the BP spike is less than the duration of the first BP pulse. The by-product management phase includes applying source power to the SP electrode at a second SP power level that is less than the first SP power level and applying bias power to the BP electrode at a third BP power level that is less than the first BP power level.

In accordance with another embodiment of the invention, a method of plasma processing includes performing a glow phase including providing a first SP pulse including a first SP power level to an SP electrode to generate a capacitively coupled plasma in a plasma processing chamber and providing a first BP pulse including a first BP power level to a BP electrode coupled to a target substrate within the plasma processing chamber. The first SP pulse terminates at the end of the glow phase. The method further includes performing an afterglow phase after the glow phase. The afterglow phase includes providing a second BP pulse to the BP electrode in an afterglow of the capacitively coupled plasma. The second BP pulse includes a second BP power level that is less than the first BP power level.

In accordance with still another embodiment of the invention, a method of plasma processing includes cyclically performing the following steps: concurrently applying SP including a first SP power level to an SP electrode to generate a capacitively coupled plasma in a plasma processing chamber, and BP including a first BP power level to a BP electrode coupled to a target substrate within the plasma processing chamber, reducing the SP from the first SP power level to a second SP power level, reducing the BP from the first BP power level to a second BP power level, and reducing the BP from the second BP power level to a third BP power level.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a schematic timing diagram of the plasma processing method, FIG. 1B illustrates a corresponding qualitative graph, and FIG. 1C illustrates a corresponding target substrate;

FIG. 4A illustrates a schematic timing diagram of the plasma processing method, FIG. 4B illustrates a corresponding qualitative graph, and FIG. 4C illustrates a corresponding target substrate;

FIG. 7A illustrates a schematic timing diagram of the plasma processing method, FIG. 7B illustrates a corresponding qualitative graph, and FIG. 7C illustrates a corresponding target substrate;

Figure 1A:
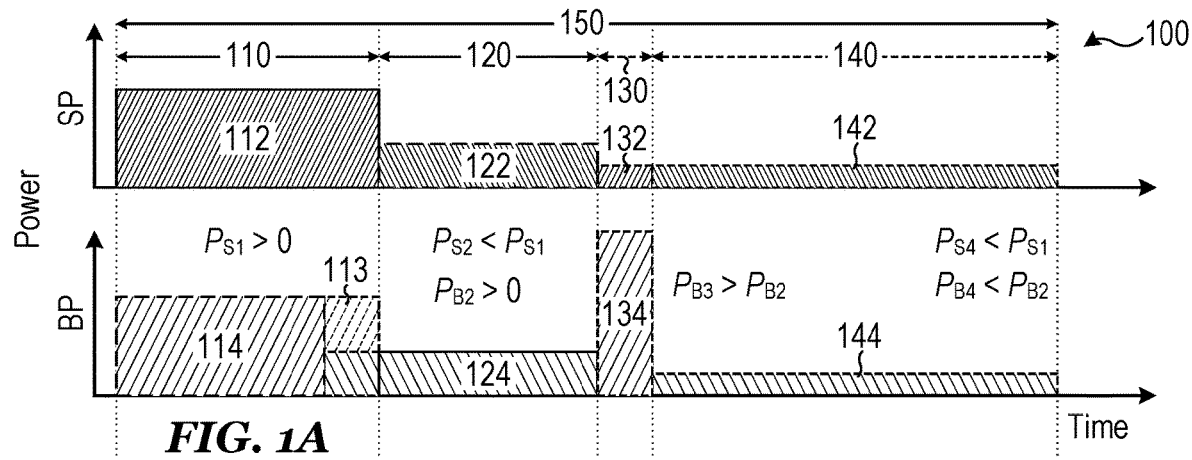
FIGS. 1A, 1B, and 1C illustrate an example plasma processing method in accordance with an embodiment of the invention, where

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

As the capabilities of high aspect plasma processes are expanded requirements such as tilt mitigation, aspect ratio-dependent etch mitigation, and ellipticity mitigation become more strict and harder to achieve (e.g. add very high power). Several techniques have been employed in attempts to meet these requirements. For example, low temperature plasma processing and tailored waveforms (e.g. combining harmonic frequencies to form various waveforms such as square wave approximations) have been used. However, these techniques are complex solutions which may be expensive and difficult to implement successfully. Further, complexity may also reduce flexibility as a result of the large number of interdependent pieces.

CCP plasma is desirable for high aspect ratio plasma processes because CCP plasma is of medium density and can couple very high voltage biases. For example, medium density plasma may also result in low degrees of etch precursor dissociation which may be necessary for selectivity and rate. CCP plasma may be particularly useful for dielectric etches such as silicon oxide ($SiO_2$), silicon nitride ($Si_3N_4$), and low-κ dielectric etches. For example, CCP plasma may be used in dielectric etches for memory structures (e.g. NAND layers).

Modifications to the application of power to the plasma system may also be used such as pulsed application of source power (SP) and bias power (BP). The source power pulse may include high frequency (HF) radio frequency (RF) power while the bias power pulses may include low frequency (LF) RF power with a direct current (DC) offset or simply be direct current (DC) power. Other RF frequency ranges may of course be used such as very high frequency (VHF), medium frequency (MF), very low frequency (VLF), and others.

Conventional pulsing methods use synchronous pulsing involving simultaneous or predominantly overlapping applications of SP pulses and BP pulses. Yet conventional synchronous pulsing has the drawback severely reduced effectiveness of the bias power to increase the voltage when the source power is on. As a result, higher power must be employed for BP pulses in an attempt to increase the voltage in the presence of the SP pulses.

Yet blind application of high power and synchronous pulsing may be especially problematic for CCP systems. For example, ion energy may be relatively low considering the magnitude of applied power. Additionally, ion temperature may be high resulting in thermally dominated ion motion. The dissociation rate in the plasma may also be relatively low which may result in lack of chemistry control, minimal ion energy/angle control, and increased deposition during the off phase (e.g. polymer may be dumped to walls and the wafer). Process space may be (marginally) increased for synchronous pulsing technology by utilizing enormous power (e.g. tens of kW for both source and bias power) but this is suboptimal for at least the aforementioned reasons in addition to being energy inefficient.

Additionally, trade-offs exist when utilizing synchronous pulsing. Synchronous pulsing techniques may use HF RF power for the SP pulses and LF RF power for the BP pulses. Large HF power is needed to create desired flux, but increased flux suppresses ion energy. Conversely, large LF power is needed for high ion energy and verticality. As the HF power increases, the plasma density increases making it harder to generate high energy ions at reasonable power resulting in very large power supplies for the BP pulses (e.g. 20 kW, 40 kW, etc.). But as the voltage is increased by larger LF power, sheath thickness is also increased, reducing the volume of the plasma and requiring more HF power for the SP pulses to maintain the plasma. The plasma generation zone is squeezed due to the larger sheath which then decreases the ion density and the ion flux.

The inherent coupling of source and bias power during synchronous application of SP pulses and BP pulses utilized in conventional pulsing methods prevents desirable decoupling of ion energy and the plasma chemistry. The result is reduced control over plasma parameters and diminished precision during plasma processing. The embodiment systems and methods of plasma processing described herein overcome these shortcomings using staggered multiphased pulsing schemes to independently control the ion to radical ratio and maximize the ability to extract voltage.

The plasma processing methods plasmas described herein may advantageously afford enhanced and independent control over various plasma parameters. For example, increased ion flux, radical flux, and the ratio between the two may be advantageously achieved. A further possible benefit of the embodiment plasma processing methods is increased control over ion energy and radical energy. In particular, desirable maximization of ion energy and ion verticality can be advantageously obtained by included antiphased the source and bias powers.

Another possible benefit of the embodiment plasma processing methods is enhanced and independent control over plasma chemistry. For instance, chemical ratios such as the fluorine (F) to carbon (C) ratio may be beneficially controlled using additional pulse phases as described herein. Enhanced chemistry control using different phases may advantageously provide appropriate degrees of polymer buildup throughout the plasma process to prevent undesirable effects such as clogging (e.g. at the opening of a small via) or cue-tipping (bowing of the mask), and mask erosion.

The plasma processing methods plasmas described herein may also advantageously enable improved process margin over conventional techniques. For example, process margin may be improved for HARC etches (e.g. for logic contacts), NAND memory etches, and other BEOL etch processes as well as other high aspect ratio processes. Additionally, the embodiment plasma processing methods may use CCP systems and methods which advantageously maintain the benefits of CCP for HARC, NAND, BEOL, and others while adding various benefits of antiphased pulsing techniques. Such combined use of capacitive coupling and antiphased pulsing may advantageously generate high power and high ion energies improving aspect ratio (e.g. up to 100, and higher).

Figure 1B:
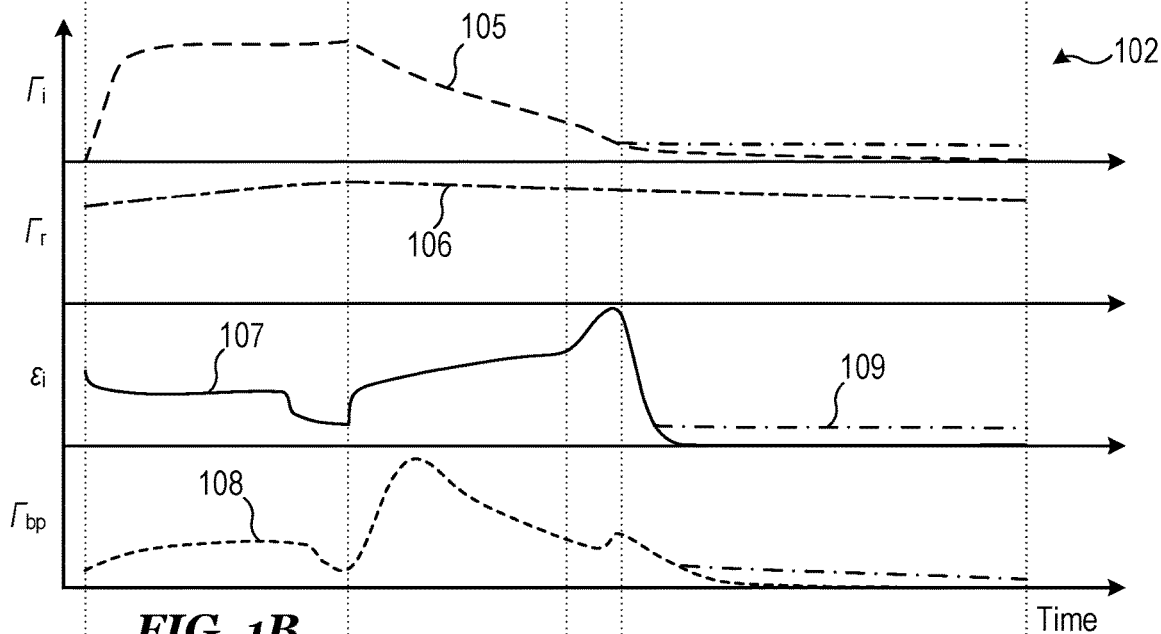
Figure 1C:
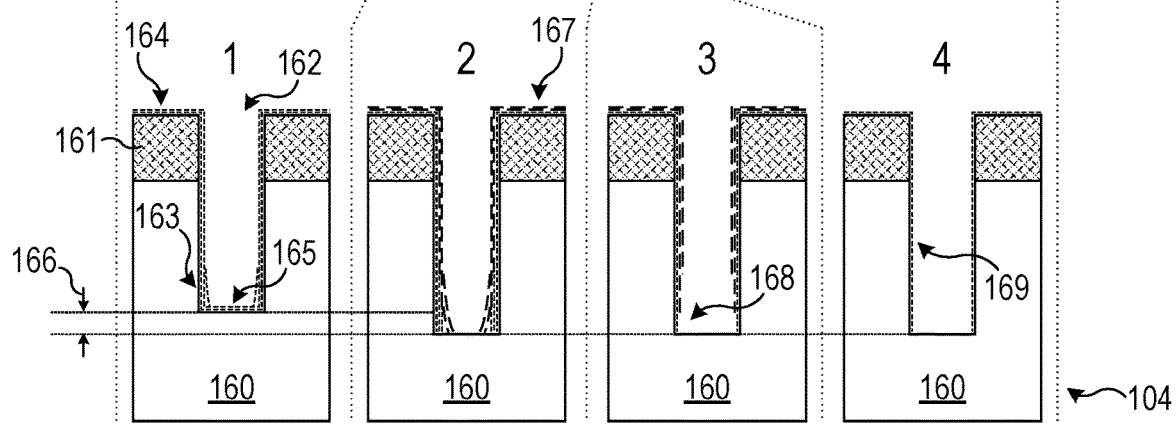
Figure 5:
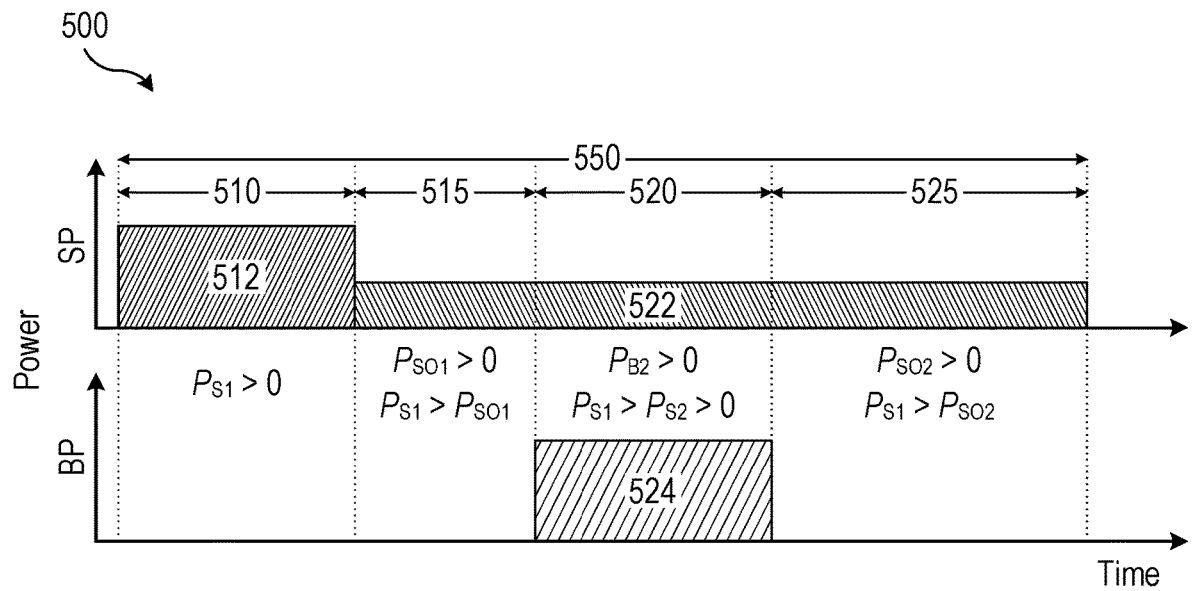
FIG. 5 illustrates a schematic timing diagram of yet another example plasma processing method in accordance with an embodiment of the invention.
Figure 6:
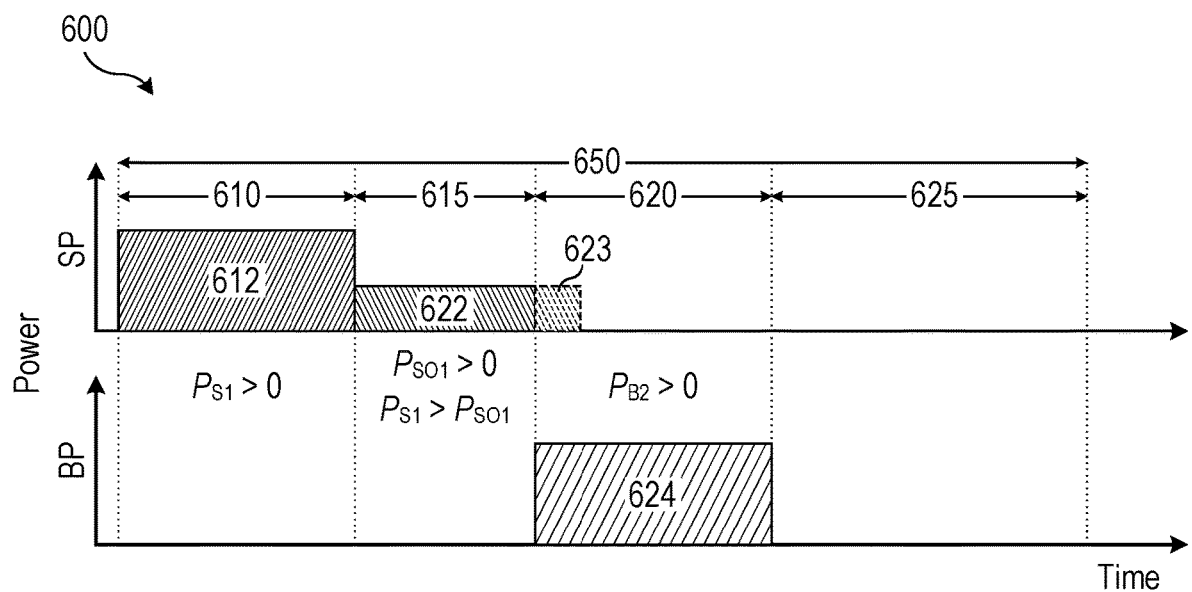
FIG. 6 illustrates a schematic timing diagram of still another example plasma processing method in accordance with an embodiment of the invention.
Figure 7A:
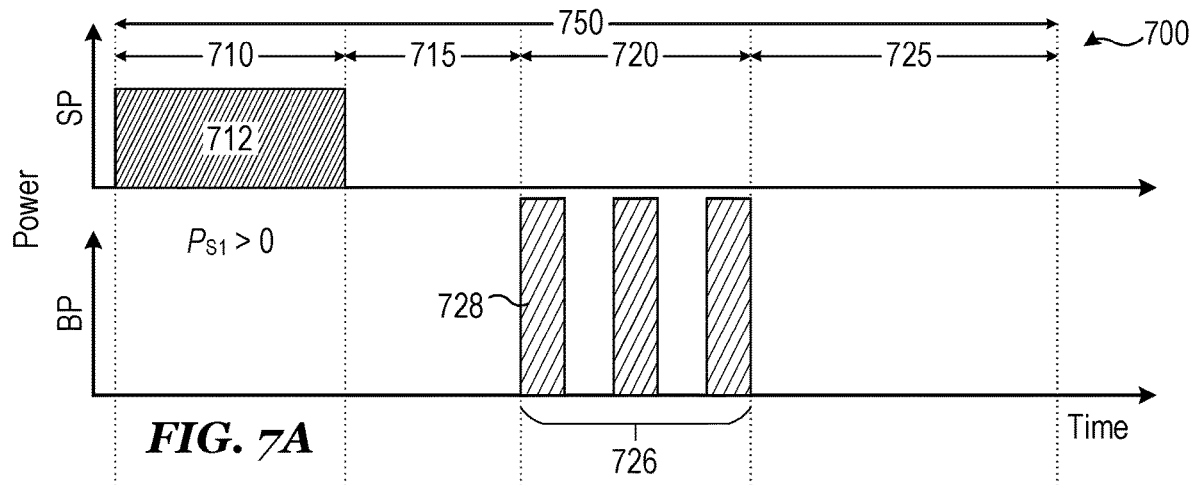
FIGS. 7A, 7B, and 7C illustrate still yet another example plasma processing method in accordance with an embodiment of the invention, where
Figure 7B:
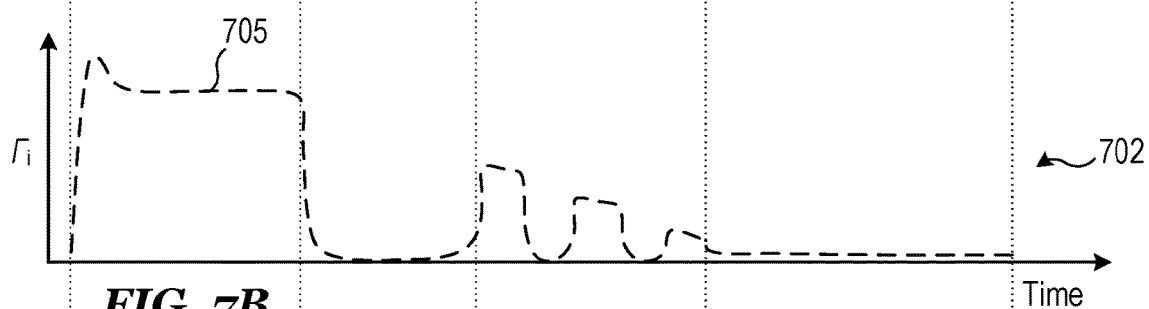
Figure 7C:
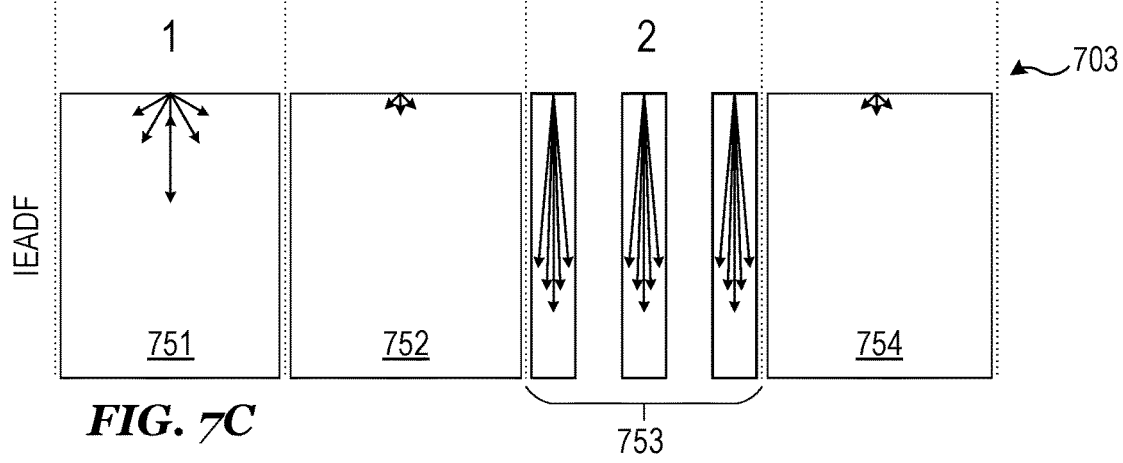

Embodiments provided below describe various systems and methods for plasma processing, and in particular, systems and methods for plasma processing that include applying pulsed source power and bias power to CCP plasmas. The following description describes the embodiments. FIGS. 1A, 1B, and 1C are used to describe an embodiment plasma processing method. Two target substrates during embodiment plasma processes are described using FIGS. 2 and 3. Another embodiment plasma processing method is described using FIGS. 4A, 4b, and 4C. FIGS. 5 and 6 are used to describe another pair of embodiment plasma processing methods. FIGS. 7A, 7B, and 7C are used to describe another embodiment plasma processing method. An embodiment capacitively coupled plasma processing system is described using FIG. 8. Three embodiment methods of plasma processing are described using FIGS. 9 and 10.

FIGS. 1A, 1B, and 1C illustrate an example plasma processing method in accordance with an embodiment of the invention, where FIG. 1A illustrates a schematic timing diagram of the plasma processing method, FIG. 1B illustrates a corresponding qualitative graph, and FIG. 1C illustrates a corresponding target substrate.

Referring to FIGS. 1A, and 1B, a schematic timing diagram 100 includes source power SP and bias power BP provided as pulses to generate reactive species and energetic ions over various phases of a cycle 150. For example, the cycle 150 may be an advanced pulsing technique (APT) applied to a CCP system. The cycle 150 includes various phases characterized by power and duration of both the SP and the BP (e.g. 4 phases as shown). In various embodiments, the cycle 150 is repeatedly performed (e.g. cyclically). For example, the cycle 150 may be performed many times (e.g. >>1), the exact number of times depending on the specific objectives of a chosen plasma process.

The cycle 150 includes a first on phase 110 during which a first SP pulse 112 is applied with power $P_{S1}>0$. A first BP pulse 114 with power $P_{B1}$ may also be applied during the first on phase 110. The first on phase 110 is defined by a duration $t_1$ equal to the pulse duration of the first SP pulse 112. The first BP pulse 114 may or may not extend to the end of the first on phase no as illustrated by an optional extended BP pulse 113.

The duration $t_1$ of the first on phase 110 is greater than about 10 μs. In some embodiments, $t_1$ is between about 10 μs and about 100 μs. In one embodiment, duration $t_1$ of the first on phase 110 is about 20 μs.

During the first on phase 110, there may be a higher degree of plasma and radical generation in conjunction with a lower degree of imparted ion energy and etching. The first on phase 110 may be referred to as an SP phase (e.g. since higher power SP dominates the effects on the plasma), a plasma generation phase or a glow phase due to the characteristic plasma and radical generation.

The first on phase 110 affects various plasma parameters as illustrated in qualitative graph 102 of FIG. 1B including an ion flux curve 105, a radical flux curve 106, an ion energy curve 107, and a by-product flux curve 108. During the first on phase 110, the ion flux $\Gamma_i$ and the radical flux $\Gamma_r$ are both high due to the application of SP in the first SP pulse 112. When BP is included in the first on phase 110, some ion energy $\varepsilon_i$ may be generated. The first BP pulse 114 may be included in order to impart some $\varepsilon_i$ (e.g. for thickness control). However, $\varepsilon_i$ is low due to the reduced the effectiveness of applying BP while also applying SP. Low $\varepsilon_i$ also may result in minimal etching and low by-product flux $\Gamma_{bp}$.

During the first on phase 110, there may be high plasma current due to increased plasma density during plasma generation. $P_{B1}$ may be relatively high in order to achieve the high bias voltage that may be required because of the high plasma current. However, in very electronegative cases, the plasma density may be low during the first on phase 110 and relatively high $P_{B1}$ may not be necessary.

During the source power phase (first on phase 110) SP is high and a plasma glow is maintained. The SP is reduced after the source power phase and the generated plasma enters an afterglow state. The afterglow may be useful because the plasma density is dropping and temperatures (ion and electron) are dropping advantageously allowing the ion angle to be narrowed and ion energy to be increased.

Advantageously, $\varepsilon_i$ may be maximized and ion verticality optimized when the ion density drops and the temperature drops in the afterglow of the SP phase. As a result, a second on phase 120 follows the first on phase 110 during which a second BP pulse 124 with duration $t_2$ and power $P_{B2}>0$ is applied. During the second on phase 120 the SP is lower ($P_{S2}<P_{S1}$) and may be zero. The inclusion of a second SP pulse 122 in the second on phase 120 may increase the absolute value of $P_{B2}$ to compensate for its reduced effect of the bias voltage in the presence of SP.

The duration $t_2$ of the second on phase 120 is greater than about 10 μs. In some embodiments, $t_2$ is between about 10 μs and about 100 μs. In one embodiment, duration $t_2$ of the first on phase 120 is about 40 μs.

As shown in qualitative graph 102, the ion energy $\varepsilon_i$ increases in the second on phase 120. Because of the increase in $\varepsilon_i$ from applied BP to the plasma afterglow, the second on phase 120 may be referred to as a BP phase, an afterglow phase, or a main etch phase (since increased $\varepsilon_i$ facilitates etching). The by-product flux $\Gamma_{bp}$ may sharply increase from by-product formation during etching. Ions are no longer being generated in the afterglow and are depleted from the plasma by the BP so the ion flux $\Gamma_i$ may decrease while the radical flux $\Gamma_r$ may remain relatively constant.

As the bias voltage increases, the ion energy ($\varepsilon_i$) increases and the ion angular distribution narrows. Ion energy control and angle control during the second on phase 120 allows it to be used as a main etch phase. When included and as shown, the first BP pulse 114 may end before the end of the first SP pulse 112 (i.e. be reduced to the level of the second BP pulse 124 prior to the reduction or removal of SP power in the second on phase 120). This may advantageously prevent or reduce an undesirable voltage spike upon entering the second on phase 120.

There may also be a delay between the end of the first on phase 110 (end of the first SP pulse 112) and the beginning of the second on phase 120 (beginning of the second BP pulse 124). Both the ion to radical ratio and $\varepsilon_i$ may also be a function of the delay between the phases as well as the optional source power during the second BP pulse 124. If a first BP pulse 114 is included in the first on phase 110, then $P_{B2}$ may be less than $P_{B1}$ since the SP during the second on phase 120 is lower and may be omitted entirely.

Several schemes involving pulsed application of SP and BP pulses may be implemented. For example, the SP may be kept constant (at a power level suitable to perpetually sustain the plasma) while only the BP is pulsed (bias pulsing). In this scenario, flux is always high due to a continuous plasma glow. However, ion energy is low when the BP is on and even lower when the BP is off (i.e. at the plasma potential).

That is, the ion energy cannot be effectively increased due to the SP being on because of the high plasma density.

As mentioned previously, SP pulses and BP pulses may also be applied synchronously (synch pulsing). In this implementation, there is a chemistry change between on and off phases, but no independent chemistry control. Further, there is weak ion energy and angle control because the SP is always on at the same time as the BP. Ion energy is again low in the on phase and then lower in the off phase (i.e. thermal). A large amount of polymer deposition may occur in the off phase.

Another pulsing scheme is to maintain the BP at a constant level and pulse the SP (source pulsing). In contrast to bias pulsing and synch pulsing, source pulsing includes phases where only the BP is on and therefore may utilize an afterglow phase. However, the BP has severely reduced effectiveness when the SP is on since the BP is held constant. Further, when both the SP and the BP are on the plasma generation zone may be squeezed (i.e. diminished) due to a larger sheath reducing the ion concentration and requiring more power.

The SP pulses and the BP pulses may also be pulsed independently from one another (asynchronous pulsing). Asynchronous pulsing may include partially overlapping SP and BP pulses or fully nonoverlapping SP and BP pulses. Some SP and BP pulses may be synchronous while others are asynchronous in an asynchronous pulsing implementation. The power of the SP and BP may also be different at different times. For this reason asynchronous pulsing implementations may advantageously provide the flexibility to decouple and enhance control of various plasma parameters during plasma processes.

Still referring to FIGS. 1A and 1B, the cycle 150 further includes an optional third phase 130 during which a third BP pulse 134 is applied for a duration $t_3$ with power $P_{B3} > P_{B2}$. For example, the optional third phase 130 may be a shorter phase ($t_3 < t_2$ and/or $t_1$) and may include a bias power $P_{B3}$ that is very high (e.g. as high as possible). Because of the short duration of $t_3$ and large magnitude of $P_{B3}$, the third BP pulse 134 may be referred to as a BP spike. For this reason, the optional third phase 130 may be referred to as a BP spike phase.

The duration $t_3$ of the optional third phase 130 is greater than about 10 μs. In some embodiments, $t_3$ is between about 10 μs and about 30 μs. In one embodiment, duration $t_3$ of the optional third phase 130 is about 20 μs.

The purpose of very high $P_{B3}$ may be to create a voltage spike (and ion energy spike) at the end of the BP phase. That is, the optional third phase 130 may be viewed as part of the BP phase occurring for a brief time $t_3$ relative to $t_2$ at the end of the second on phase 120. During the optional third phase 130, the SP is removed or further reduced (including optional an optional third SP pulse 132 as shown).

During the optional third phase 130, $\varepsilon_i$ spikes while $\Gamma_i$ continues to decrease due to the lack of plasma generation and further depletion of the ions from the plasma. A corresponding spike in $\Gamma_{bp}$ may also occur due to etching from energetic ions. The size of this $\Gamma_{bp}$ spike may smaller than the spike in the second on phase 120 since there are fewer ions and fewer energetically favorable regions than at the start of the BP phase.

An optional fourth phase 140 may also be included in the cycle 150. During the optional fourth phase 140, both the SP and the BP may be reduced or removed entirely ($P_{S4} < P_{S1}$, $P_{B4} < P_{B2}$) for a duration $t_4$. For example, a fourth BP pulse 144 may be included or omitted. Similarly, a fourth SP pulse 142 may be included. The power of the third SP pulse 132 may be similar to the power of the fourth SP pulse 142. That is, if one is omitted both may be omitted and if one is included, both may have the same power. However, this is not a requirement.

The duration $t_4$ of the optional fourth phase 140 is greater than about 100 μs. In some embodiments, $t_4$ is between about 100 μs and about 2 ms. In one embodiment, duration $t_4$ of the optional fourth phase 140 is about 200 μs.

The optional fourth phase 140 may provide a delay between the BP phase and the SP phase of the next cycle to allow by-products to be removed from a plasma processing chamber (i.e. pumped out). Since by-products may be removed and controlled by reduced or removed power, the optional fourth phase 140 may be referred to as an off phase or a by-product management phase.

In some cases by-product buildup may still occur at undesirable levels during the optional fourth phase 140 in the absence of any power. Therefore, as shown, just enough SP and/or BP may be applied during the optional fourth phase 140 to control buildup. This may result in slight increases in $\Gamma_i$, $\varepsilon_i$, and $\Gamma_{bp}$ during the optional fourth phase 140 as indicated by the alternate off-phase curves 109 in FIG. 1B.

Referring now to FIG. 1C, a target substrate 304 during various stages of processing corresponding to the phases of the plasma processing method of FIGS. 1A and 1B is shown. In this specific example, the plasma processing method is applied to a high aspect ratio etching process. The target substrate 104 includes an etchable material 160. In some embodiments, the etchable material 160 comprises silicon. In one embodiment the etchable material 160 is bulk silicon. In various embodiments, the etchable material 160 is a dielectric and is $SiO_2$ in one embodiment. Alternatively, the etchable material may be $Si_3N_4$, a high-κ dielectric, and others. Further, the etchable material 160 may also be a multilayer structure (e.g. alternating layers of $SiO_2/Si_3N_4$, or of $Si/SiO_2$, etc.).

A mask 161 is disposed over the etchable material 160. The mask 161 may protect the etchable material 160 during the etching process. The target substrate 104 is shown here at an intermediate step where a recess 162 has already been formed through an opening in the mask 161. For example, the recess 162 may be a hole (substantially 1D structure) or a trench (substantially 2D structure).

During the first on phase 120, polymer may be formed at exposed surfaces of the mask 161 and the etchable material 160. The polymer may form mainly at top surfaces of the mask and build up at the bottom of the recess 162 in the corners (illustrated as corner buildup 163). Polymer buildup may advantageously protect mask surfaces and sidewalls as well as form a mixing layer 165 with the etchable material 160 that facilitates etching. For instance, the mixing layer 165 may be include species from both the etchable material 160 and the etchant (e.g. $SiO_2$ and $CF_2$).

As a specific example, the high aspect ratio etching process may be an oxide etch that uses a fluorocarbon ($C_xF_y$) etchant. At a high level, chemistry control for such a process may be thought of as controlling the ratio of fluorine to fluorocarbon species at the target substrate 104. For example, $CF_2$ species (radicals and ions) may have a particularly high representation among the various generated fluorocarbons. Therefore, chemistry control can be conceptually thought of as controlling ratio $F:CF_2$ at various phases of the oxide etch. In the first on phase 120, $C_xF_y$ species become dissociated in the plasma generating F, $CF_2$, and $CF_2^+$ (among potentially many other species) which causes $F:CF_2$ to increase.

After the first on phase 110, applied BP in the afterglow caused by the reduction or removal of SP during the second on phase 120 facilitates etching of the oxide in the recess 162. Ions (e.g. $CF_2^+$) generated in the first on phase 110 are given energy by the bias voltage from the BP and may bombard the mixing layer 165 to etch the bottom of the recess 162 to a cycle etch depth 166 (e.g. depth per BP pulse in the second on phase 120).

In contrast to the previous phase, $F:CF_2$ decreases in the second on phase 120 (e.g. due to recombination). Increased duration ($t_2$) may advantageously allow greater leverage of this chemistry change. For instance, more carbon may be desirable to protect the mask during the main etch since the ions are more energetic.

By-products 167 that are generated during the second on phase 120 may also deposit on the top and sidewalls of the mask 161 and sidewalls of the recess 162. This by-product buildup may also provide protection through passivation. However, the by-products 167 may also deposit in the corners and bottom of the recess 162. As shown, the by-products 167 may further exacerbate the effects of the corner buildup 163 that begin in the first on phase 110.

HF power may be used for the SP pulses while LF power may be used for the BP pulses during the cycle 150. In one embodiment, the SP pulses comprise RF power with frequency greater than about 13.56 MHz and about 40 MHz in one embodiment. In other embodiments, the HF power may be 27 MHz, 40 MHz, 60 MHz, 100 MHz, 200 MHz, and higher. The lower the frequency of the LF (BP) power, the greater the coupling resulting in higher ion energy $\varepsilon_i$. For example, sufficiently low frequency BP so as to be at a bimodal frequency may be desirable. In some embodiments the BP pulses comprise RF power with frequency less than about 13 MHz and about 500 kHz in one embodiment. For example, the LF power may be in the range of about 100 kHz to about 13 MHz. In other embodiments, the BP pulses are DC pulses.

When included, the optional third phase 130 may serve as a corner etch phase by generating an energy spike that narrows the ion angular distribution for interior corner etch 168. The lower SP combined with very high BP may advantageously increase the effectiveness of the BP pulse increasing the voltage and generating an ion energy spike. Since the majority of ions in the afterglow have been depleted during the second on phase 120, there the ion flux $\Gamma_i$ is lower thereby beneficially reducing the risk of sputtering while still providing highly energetic ions to the bottom of the recess 162.

The narrow angular distribution and high energy of the ions in the optional third phase 130 may advantageously deliver desired energy to clean up the corners. This widens the undesirable 'V' shape at the bottom of the recess 162 as shown schematically in FIG. 1C. Due to the low flux, short duration, and the lack of a mixing layer at the bottom of the recess 162, the etch depth may not be significantly affected by the optional third phase 130. Since the plasma process may be performed cyclically, the optional third phase 130 may be used to control buildup of films.

The optional fourth phase 140 may be included for mask and sidewall cleanup 169. For example, by-products that are less volatile than desired (e.g. residual hard mask material, etc.) may be pumped out during the optional fourth phase 140. However, in some applications (e.g. dielectric etches) the optional fourth phase 140 may not be used because F may sufficiently volatilize Si products resulting in negligible by-product buildup per cycle.

The optional fourth phase 140 may advantageously reduce clogging in future cycles of the plasma process. In some cases, some SP and/or BP may be required to release by-products from the mask and sidewall surfaces to allow their removal from the system. The duration of the optional fourth phase 140 may be on the order of the residence time of the by-products.

In general, the duty cycle (e.g. the percent on time for each pulse in a given cycle) may vary widely depending on application specifics. For example, each of the phases may be anywhere in the range of about 3% to about 90%. Further, the specific timing of each phase may also depend on the pulse frequency. For example, very long phases may reduce the pulse frequency.

Figure 2:
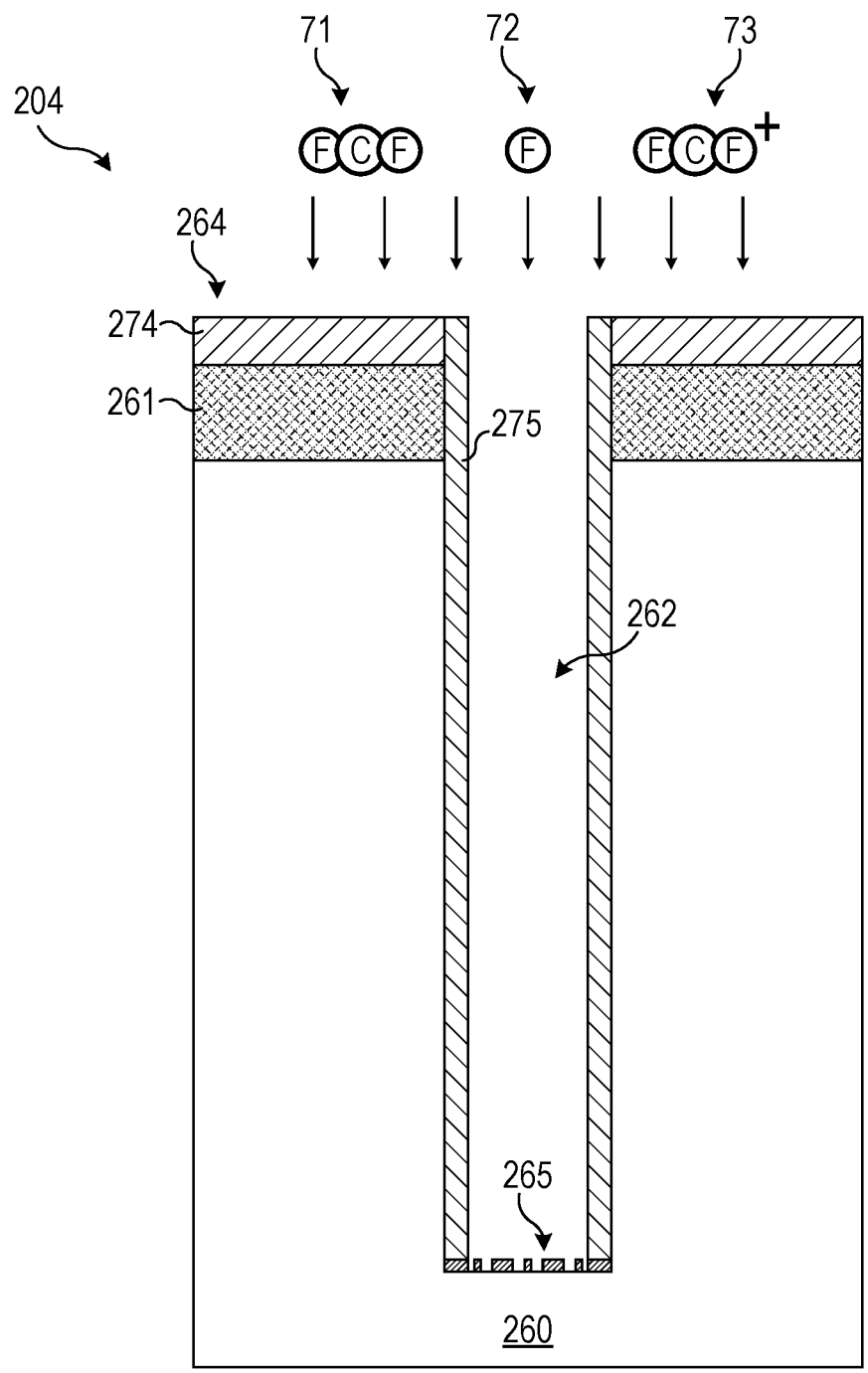
FIG. 2 illustrates a schematic diagram of a target substrate during an example plasma process utilizing balanced control of plasma parameters in accordance with an embodiment of the invention.

FIG. 2 illustrates a schematic diagram of a target substrate during an example plasma process utilizing balanced control of plasma parameters in accordance with an embodiment of the invention. The target substrate of FIG. 2 may be a specific implementation of other target substrates described herein such as the target substrate of FIG. 1C, for example. Similarly labeled elements may be as previously described.

Referring to FIG. 2, a target substrate 204 includes an etchable material 260, a mask 261, and a recess 262. It should be noted that here and in the following a convention has been adopted for brevity and clarity wherein elements adhering to the pattern "_10" may be related implementations of a plasma processing chamber in various embodiments. For example, the etchable material 260 may be similar to the etchable material 160 except as otherwise stated. An analogous convention has also been adopted for other elements as made clear by the use of similar terms in conjunction with the aforementioned three-digit numbering system.

During a plasma process such as any of the embodiment plasma processes described herein, plasma parameters may be controlled so as to achieve desirable results. The specific example illustrated schematically by target substrate 204 is of a plasma etching process (e.g. high aspect ratio) in which a fluorocarbon (FC) is used as an etchant. This process may be useful for HARC and NAND applications and others. The FC etchant may be any suitable FC species having the chemical formula $C_xF_y$. For example, the FC etchant may be $CF_4$, $C_4F_8$, $C_5F_8$, $C_2F_6$, $C_4F_6$, $C_5F_6$, and others. The FC etchant may also be a hydrofluorocarbon (e.g. $CHF_3$, $CH_3F$) and/or in combination with $O_2$, $H_2$, $NF_3$, $SF_6$, Ar, He, etc.

Three primary categories of species may be delivered to the target substrate 204 as shown: FC radicals 71, F radicals 72, and ions 73. The FC radicals 71 may include any radicals comprising both F and C ($F_xC_y$). In one embodiment the FC radicals 71 comprise $CF_2$ radicals (as shown). In some instances many different FC radical species may be delivered to the majority of the FC radicals 71 being $CF_2$. The F radicals 72 are electrically neutral F atoms.

A large variety of ions 73 may be generated in the plasma during the plasma etching process. In various embodiments, the ions 73 comprise FC ions. In some embodiments, the ions 73 comprise $C_xF_y^+$ ions and comprise $CF_2^+$ ions ion one embodiment. For example, as above, although many species of FC ions may exist, the ions 73 may predominantly include $CF_2^+$ ions. The ions 73 may also comprise F ions among others (e.g. ions from inert species such as $Ar^+$).

During the plasma etching process, polymer 264 may build up on surfaces of the mask 261 and exposed surfaces of the etchable material 260 (i.e. sidewalls and bottom of the recess 262). The polymer 264 may serve to advantageously passivate the mask 261 and sidewalls of the recess 262 by forming a mask surface passivation layer 274 and a sidewall passivation layer 275 respectively. For example, the polymer 264 may be a carbon polymer. Due to geometrical (and other) considerations, the polymer 264 may build up in larger quantities at the surface of the mask 261 than at the sidewalls (as shown).

At the bottom of the recess 262, a mixing layer 265 may also form. For example, the mixing layer may include various compounds formed from elements originating from both the etchable material 260 and the etchant. In some embodiments, the mixing layer 265 comprises both Si and O and in one embodiment, the mixing layer 265 is formed primarily through interactions of $CF_2$ and $SiO_2$ species. The mixing layer 265 may advantageously be particularly susceptible to removal via bombardment of energetic ions (e.g. $CF_2^+$ ions).

Several desirable characteristics are illustrated schematically in FIG. 2. For example, the recess 262 exhibits vertical sidewalls all the way to the bottom of the recess 262. Specifically, widening of the recess 262 is not experienced at the top, in the middle (e.g. no bowing), or at the bottom of the recess 262. Additionally, the polymer 264 is desirably formed on the mask 261 and in the recess 262. For example, the mask surface passivation layer 274 does not extend over the opening of the recess 262, but also does not expose any portion of the mask 261. Further, the sidewall passivation layer 275 is formed uniformly to the bottom of the recess 262 and is thinner than the mask surface passivation layer 274. A mixing layer 265 is formed at the bottom (and may extend a small amount up the sides as shown in FIG. 1C) of the recess 262.

The desirable characteristics shown in FIG. 2 may be achieved using the embodiment plasma processing methods described herein. In particular, independent (or nearly independent) control of the flux of the FC radicals 71, the F radicals 72, and the ions 73 at various the plasma process may advantageously facilitate the desirable characteristics. For example, providing sufficient FC radicals 71 may provide the depicted mask protection and mitigate sputtering. Further, sufficient FC radicals 71 may also serve to protect the sidewalls.

Additionally, providing sufficient F radicals 72 and ions 73 may prevent clogging of the opening to the recess 262. That is, the F radicals 72 may react with the polymer 264 and the ions 73 may dislodge the polymer 264 via bombardment to provide thickness control of the mask surface passivation layer 274 (and also the sidewall passivation layer 275). Further, sufficient vertical ions 73 may be provided to prevent bowing of the recess 262 (e.g. due to etching of the sidewalls from wide angle ions). Similarly, providing sufficient energetic ions 73 and FC radicals 71 may advantageously maintain the etching process (e.g. at the mixing layer 265).

Other factors may also affect the control of the delivery of the FC radicals 71, the F radicals 72, and the ions 73 to the substrate. For example, pressure in the plasma processing chamber may affect ion energy and ion flux. Additionally, the degree that the radical flux can be modulated may depend on the residence time.

All of the above considerations may be important to maintain a consistent etch profile and a constant etch rate over time. The desired (i.e. optimal) flux of the various species may differ depending on the phase in a cycle of the plasma process. Moreover, the system may change over time. Consequently, the control of the parameters may be dynamically changed in subsequent cycles of the plasma process to advantageously maintain a constant etch rate and consistent etch profile (e.g. tens of minutes into an etching process).

For example, initially an SP pulse and a BP pulse may be utilize as the etch rate is higher when the recess is more shallow. However, as the process continues and the recess becomes deep the etch rate may slow. The BP pulse may be lengthened and/or a BP power spike (e.g. a corner etch phase) may be utilized to compensate and maintain a consistent etch profile and constant etch rate. Dynamic control of the plasma parameters may play a major role when the plasma process is not self-limited.

Figure 3:
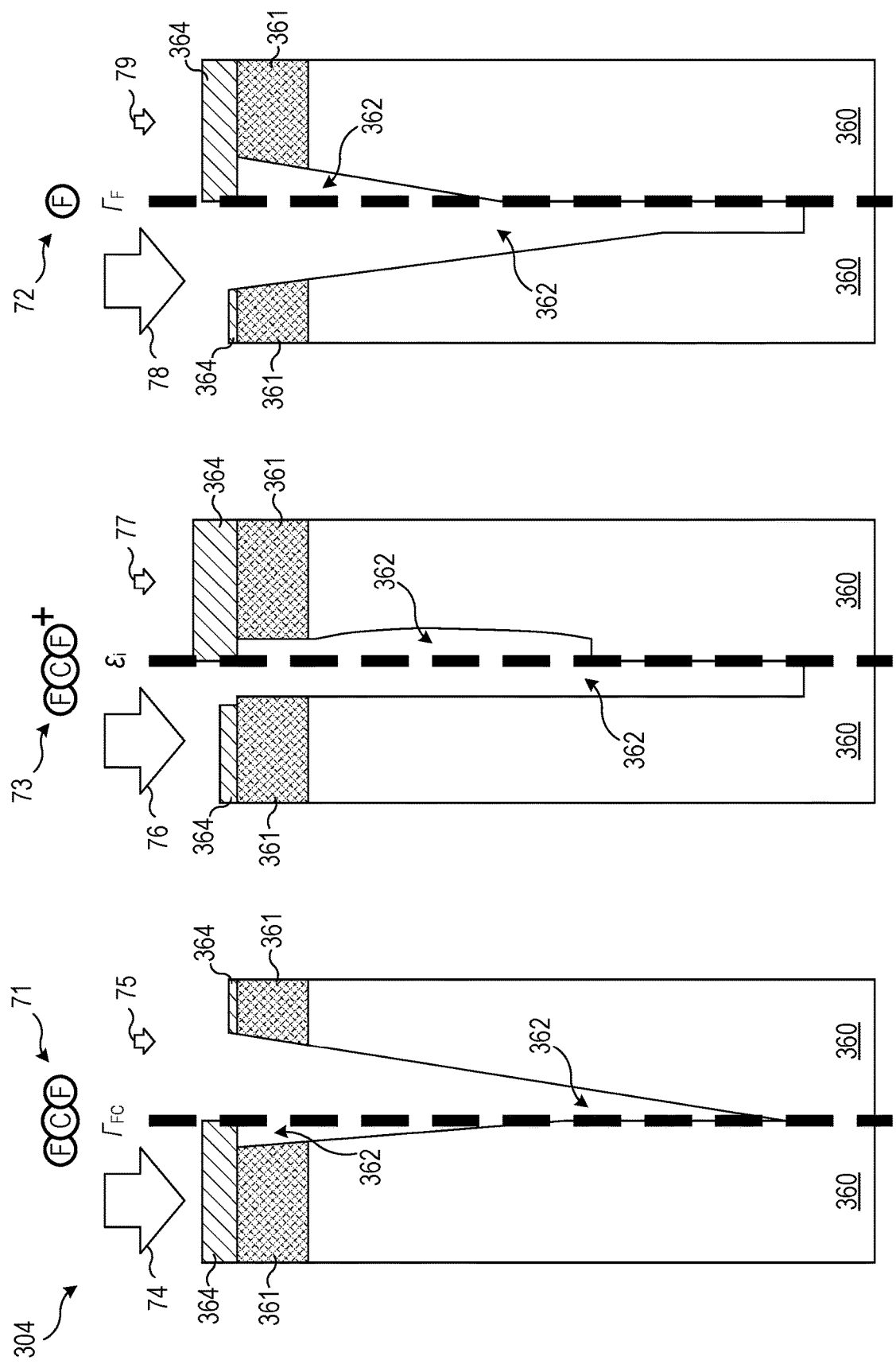
FIG. 3 illustrates a schematic diagram of another target substrate during an example plasma process utilizing imbalanced control of plasma parameters in accordance with an embodiment of the invention.

FIG. 3 illustrates a schematic diagram of another target substrate during an example plasma process utilizing imbalanced control of plasma parameters in accordance with an embodiment of the invention. Similarly labeled elements may be as previously described.

Referring to FIG. 3, a target substrate 304 includes an etchable material 360, a mask 361, a recess 362, and a polymer 364 disposed over the mask 361. The depiction of the target substrate 304 is similar to that of the target substrate 204 except that various undesirable effects from providing excessive or insufficient amounts of the FC radicals 71, F radicals 72, and ions 73 at the recess 362 are demonstrated rather than the desirable effects of FIG. 2. The sidewall passivation layer is not shown for clarity.

As previously discussed, sufficient quantities of FC radicals 71 (FC radical flux $\Gamma_{FC}$) may have desirable effects during a plasma process. However, an excessive FC radical flux 74 at the recess 262 may result in an overhang that undesirably prevents or reduces (clogs) further etching. In contrast, an insufficient FC radical flux 75 may result in too little polymer 364 buildup in the mask surface and undesirably widen the opening of the recess 362 as the mask edge is eroded. Such widening may also cause the sidewalls to be undesirably sloped ("V" shaped). Erosion may result in critical dimension (CD) loss (e.g. tapering).

Similarly, sufficiently energetic ions (ion energy $\varepsilon_i$) may also have desirable effects. Yet excessive ion energy 76 may remove polymer 364 protecting the mask and facilitate undesirable mask erosion. Conversely, insufficient ion energy 77 may allow polymer 364 to remain at the opening of the recess 362 and cause clogging. The low ion energy may also prevent ions from reaching the bottom of the recess 362 and increase the angular distribution of the ions causing shallow etch depth (e.g. reducing sidewall verticality) and bowing (e.g. due to lack of sidewall passivation) as shown. The ions 73 may also lose energy due to sidewall scatter further lowering the etch rate.

For this reason providing BP during an SP phase (e.g. the first on phase 110 of FIG. 1A) may be advantageously afford thickness control for polymer buildup over time. Preventing the clogging of the opening of the recess 362 may be particularly important when the mask 361 is thick. For example, a NAND mask may be 2 μm thick. However, even hard masks used in HARC processes may benefit from optimal polymer deposition to ensure high aspect ratios (e.g. 100 or more). Further, selectivity may rely on polymer deposition, but too much reduces or prevents etching.

Sufficient F radicals 72 (F radical flux $\Gamma_F$) also provide beneficial effects within an optimal range. But, as with the FC radicals 71 and the ions 73, too little or too much can be problematic. For example, excessive F radical flux 78 may lead to erosion while insufficient F radical flux 79 may lead to clogging.

Figure 4A:
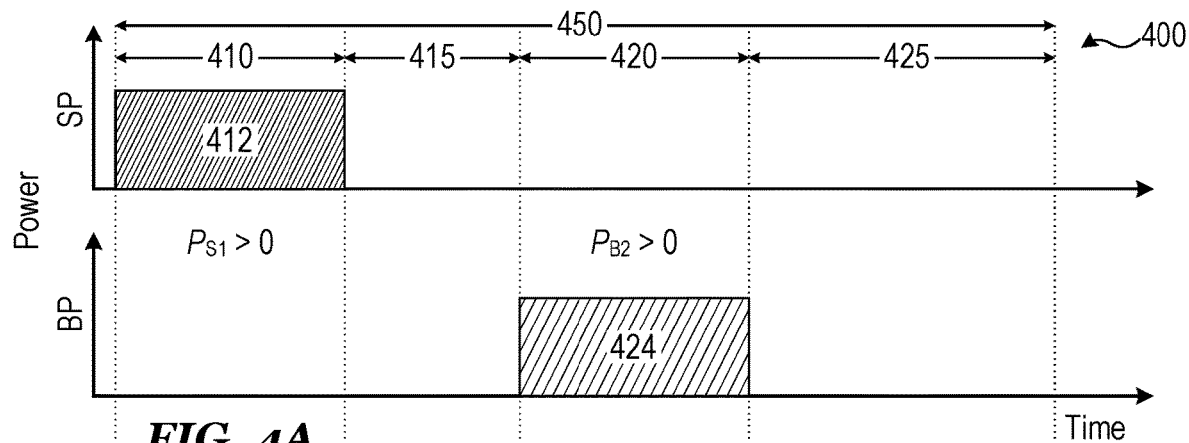
FIGS. 4A, 4B, and 4C illustrate another example plasma processing method in accordance with an embodiment of the invention, where
Figure 4B:
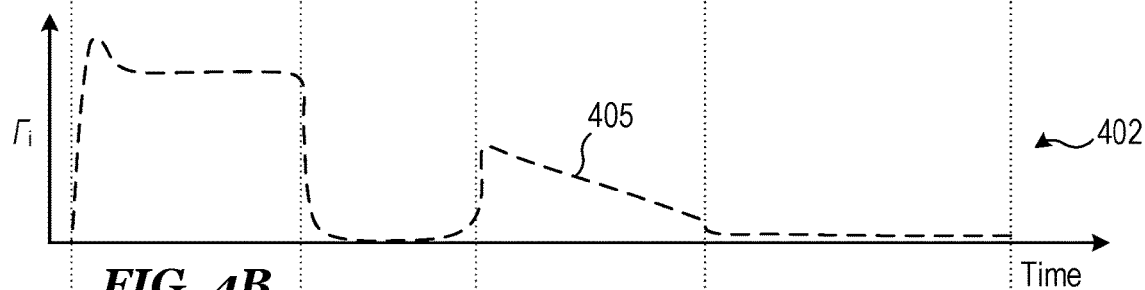
Figure 4C:
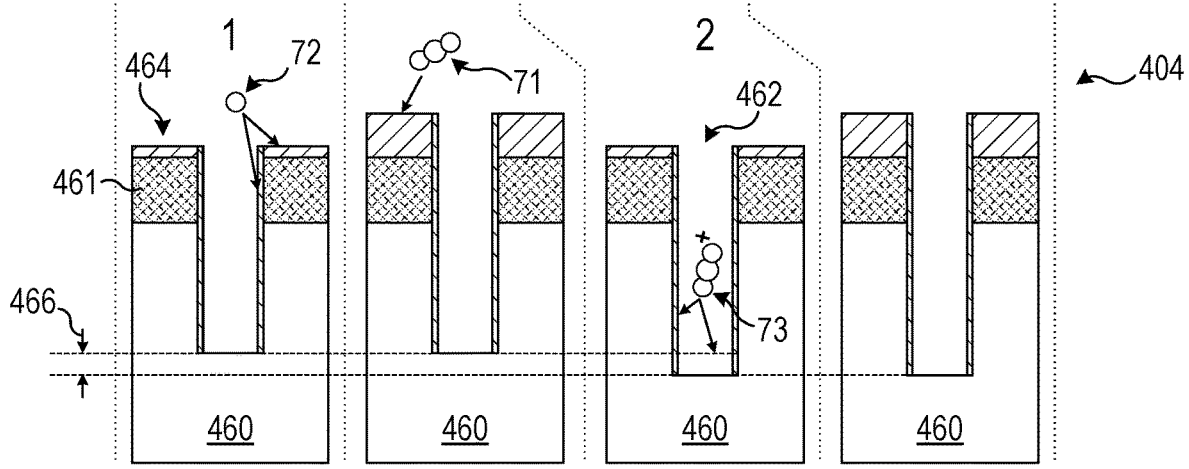

FIGS. 4A, 4B, and 4C illustrate another example plasma processing method in accordance with an embodiment of the invention, where FIG. 4A illustrates a schematic timing diagram of the plasma processing method, FIG. 4B illustrates a corresponding qualitative graph, and FIG. 4C illustrates a corresponding target substrate. The plasma processing method of FIGS. 4A, 4B, and 4C may be combined with or be a specific implementation of other plasma processing methods described herein such as the plasma processing method of FIGS. 1A, 1B, and 1C, for example. Similarly labeled elements may be as previously described.

Referring to FIGS. 4A and 4B, a schematic timing diagram 400 includes source power SP and bias power BP provided as pulses to generate reactive species and energetic ions over various phases of a cycle 450. The cycle 450 includes various phases characterized by power and duration of both the SP and the BP. The cycle 450 includes a first on phase 410 during which an SP pulse 412 is applied with power $P_{S1}>0$ and a second on phase 420 during which a BP pulse 424 is applied with power $P_{B2}>0$.

In addition to the first on phase 410 and the second on phase 420 (which may be similar to the first on phase 110 and the second on phase 120 of FIG. 1A), the schematic timing diagram 400 also includes a first off phase 415 preceding the beginning of the BP pulse 424 as well as a second off phase 425 following the end of the BP pulse 424. The first off phase 415 is a delay between the SP phase and the BP phase of the plasma process.

The second off phase 425 is also a delay, but between the BP phase and a subsequent SP phase. For example, the second off phase 425 may also serve as a by-product management phase (e.g. be similar to the optional fourth phase 140 of FIG. 1A). Alternatively, the second off phase 425 may be an independent phase included in addition to or instead of a by-product management phase.

A qualitative graph 402 including an ion flux curve 405 corresponding to the schematic timing diagram 400 is illustrated in FIG. 4B. The behavior of the ion flux $\Gamma_i$ in the first on phase 410 and the second on phase 420 is similar to the analogous phases in FIG. 1B. However, in contrast, $\Gamma_i$ decreases substantially to zero during the first off phase 415 and the second off phase 425. This effective pause in ion delivery allows chemistry control and may advantageously facilitate desirable polymer buildup control.

Referring now to FIG. 4C, a target substrate 404 includes an etchable material 406, a mask 461, and polymer 464 formed on the mask 461 and in a recess 462. As shown, the delays between the SP phase and the BP phase may afford chemistry control decoupled from ion control by allowing the ratio of $F:CF_2$ to decrease before applying the BP pulse. The increased concentration of C at the target substrate 404 may advantageously allow polymer 464 to build up thereby protecting the mask 461 and sidewalls of the recess 462 from ion bombardment damage.

Since the polymer buildup is a neutral-driven process (indicated by FC radicals 71), polymer 464 may primarily form on the mask surface rather than at the bottom of the recess 462. In the second on phase 420, ions 73 are delivered to the bottom of the recess 462 perform the main etch shown by cycle etch depth 466. The mask 461 may be advantageously protected by the polymer 464 built up during the first off phase 415. Similarly, the F radicals 72 generated in the first on phase 410 may also remove polymer 464. The second off phase 425 may provide the benefit of allowing polymer 464 to build up and protect the mask 461 during the first on phase 410.

The first off phase duration $t_{O1}$ (of the first off phase 415) and the second off phase duration $t_{O2}$ (of the second off phase 425) may be appropriately chosen to allow sufficient polymer to build up and protect the mask 461 without building up too much polymer which could result in clogging. In various embodiments, $t_{O1}$ is greater than about 5 µs. In some embodiments, $t_{O1}$ is between about 5 µs and about 50 µs. However in other embodiments, $t_{O1}$ is between about 5 µs and about 10 µs. In one embodiment, the first off phase duration $t_{O1}$ is about 20 µs.

The second off phase duration $t_{O2}$ may be similar to or different from the first off phase duration $t_{O1}$. In general, $t_{O2}$ may be shorter than $t_{O1}$ (e.g. due to the reduced rate of polymer erosion in the first on phase 410 as opposed to the second on phase 420). In various embodiments $t_{O2}$ is greater than about 5 µs. In some embodiments, $t_{O2}$ is between about 5 µs and about 10 µs In one embodiment, the second off phase duration $t_{O2}$ is about 5 µs.

FIG. 5 illustrates a schematic timing diagram of yet another example plasma processing method in accordance with an embodiment of the invention. The plasma processing method of FIG. 5 may be combined with or be a specific implementation of other plasma processing methods described herein such as the plasma processing method of FIGS. 1A, 1B, and 1C, for example. Similarly labeled elements may be as previously described.

Referring to FIG. 5, a schematic timing diagram 500 includes source power SP and bias power BP provided as pulses to generate reactive species and energetic ions over various phases of a cycle 550. The cycle 550 includes various phases characterized by power and duration of both the SP and the BP. The cycle 550 includes a first on phase 510 during which a first SP pulse 512 is applied with power $P_{S1}>0$ and a second on phase 520 during which a BP pulse 524 is applied with power $P_{B2}>0$ in addition to a second SP pulse 522 with power $P_{S2}<P_{S1}$.

A first off phase 515 and a second off phase 525 are also included during which no BP is provided. As shown, the second SP pulse 522 may be provided during one or both of the first off phase 515 and the second off phase 525. For example, the SP may be maintained at a lower level until the following SP phase. The lower SP during the second on phase 520 in combination with the first off phase 515 may advantageously enable further chemistry control and/or ion control.

FIG. 6 illustrates a schematic timing diagram of still another example plasma processing method in accordance with an embodiment of the invention. The plasma processing method of FIG. 6 may be combined with or be a specific implementation of other plasma processing methods described herein such as the plasma processing method of FIGS. 1A, 1B, and 1C, for example. Similarly labeled elements may be as previously described.

Referring to FIG. 6, a schematic timing diagram 600 includes source power SP and bias power BP provided as pulses to generate reactive species and energetic ions over various phases of a cycle 650 which includes a first on phase 610 during which a first SP pulse 612 is applied with power $P_{S1}>0$, a first off phase 615 during which a second SP pulse 622 is applied with power $P_{SO1}<P_{S1}$, a second on phase 620 during which a BP pulse 624 is applied with power $P_{B2}>0$, and an optional second off phase 625 during which no SP or BP is applied.

In contrast to the plasma processing method of FIG. 5, the SP is not maintained in the second on phase 520 or the optional second off phase 525. Optionally, the second SP pulse 622 may be extended into (or even through) the second on phase 620 as illustrated by the optional second SP pulse extension 623. The additional current during the first off phase 615 but not in the optional second off phase 625 may advantageously facilitate increased polymerization during the first off phase 615 compared to the second off phase 625.

FIGS. 7A, 7B, and 7C illustrate still yet another example plasma processing method in accordance with an embodiment of the invention, where FIG. 7A illustrates a schematic timing diagram of the plasma processing method, FIG. 7B illustrates a corresponding qualitative graph, and FIG. 7C illustrates a corresponding target substrate. The plasma processing method of FIGS. 7A, 7B, and 7C may be combined with or be a specific implementation of other plasma processing methods described herein such as the plasma processing method of FIGS. 1A, 1B, and 1C, for example. Similarly labeled elements may be as previously described.

Referring to FIG. 7A, a schematic timing diagram 700 includes source power SP and bias power BP provided as pulses to generate reactive species and energetic ions over various phases of a cycle 750 which includes a first on phase 710 during which a first SP pulse 712 is applied with power $P_{S1} > 0$, a first off phase 715, a second on phase 720 during which BP is applied, and an optional second off phase 725. The duration of the second on phase 720 may be on the order of microseconds, such as 20 μs.

In contrast to the second on phase 420 of FIG. 4A, the second on phase 720 includes a BP pulse train 726 comprising a plurality of BP spikes 728. For example, each BP spike 728 may be a DC pulse of short duration (e.g. 1 μs DC pulses, 400 kHz pulses, or longer such as 13 MHz, 1 MHz, 900 kHz, etc.). Alternatively, each BP spike 728 may comprise a train of DC pulses.

Referring now to FIGS. 7B and 7C, a qualitative graph 702 and a qualitative diagram of the ion energy and angle distribution 703 (IEADF) corresponding to the schematic timing diagram 700 is shown. The qualitative graph 702 includes an ion flux curve 705 similar to ion flux curve 405 of FIG. 4B except that $\Gamma_i$ drops to substantially zero after each BP spike 728 during the second on phase 720.

As shown in block 751, the ions have medium energy and wide angle during the first on phase 710. During the first off phase 715, the ions still have a wide angle, but much less energy (e.g. thermal) as shown in block 752. Each BP spike 728 of the BP pulse train 726 during the second on phase 720 generates highly energetic ions with a narrow angular distribution as shown in block 753. Block 754 again illustrates the very low ion energy with the SP and BP are off during the second off phase 725.

The inclusion of the BP pulse train 726 in the second on phase 720 may advantageously reduce the flux of ions with wide angular distribution during the BP phase. For example, ions may lose verticality while traveling through well-developed sheaths (e.g. due to collisions). The sheath may become more than more developed over time with applied BP. Providing short duration BP spikes 728 may prevent the sheath from becoming well developed and advantageously deliver high verticality ions throughout the second on phase 720.

Figure 8:
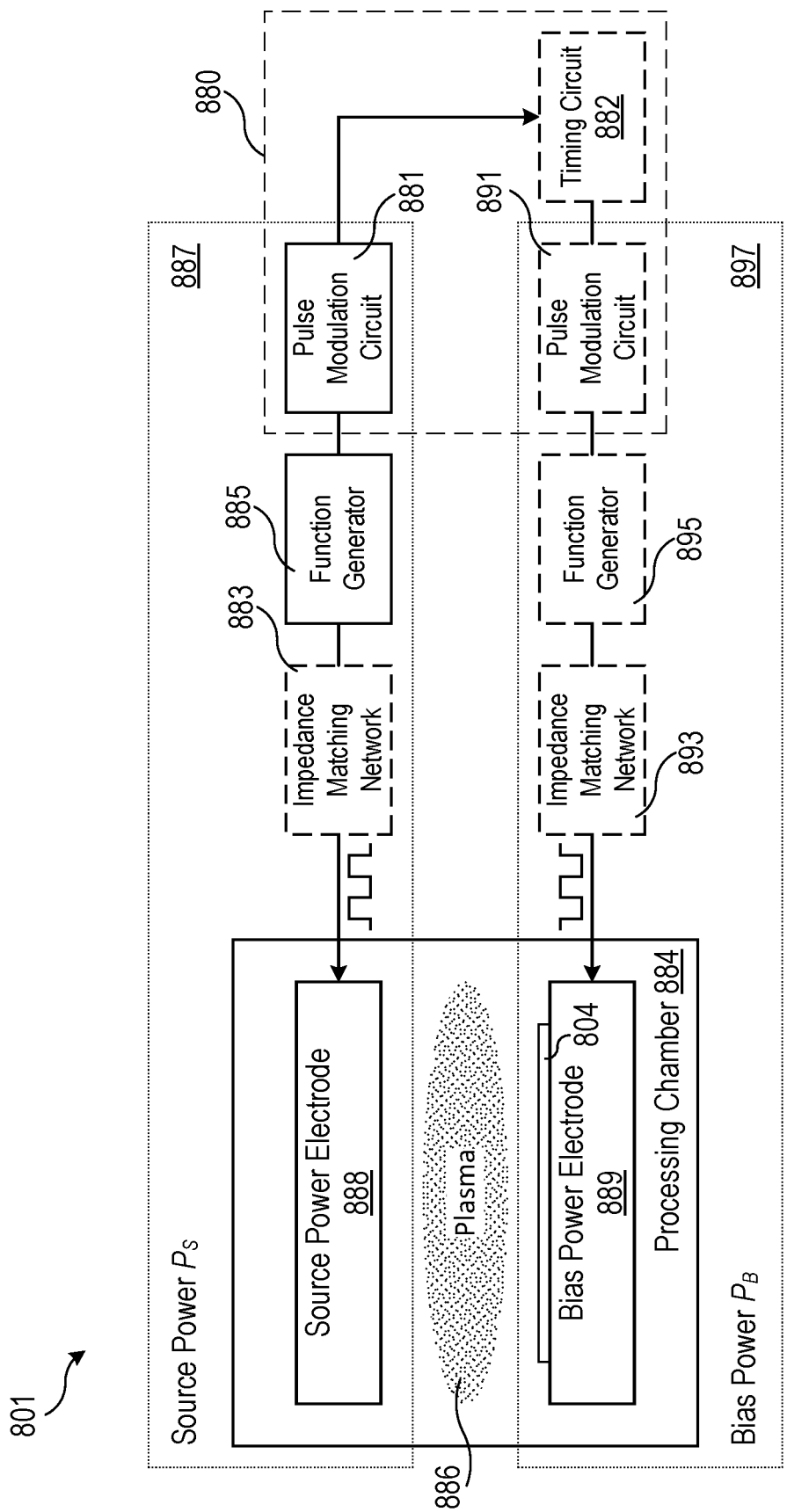
FIG. 8 illustrates a block diagram of an example capacitively coupled plasma system in accordance with an embodiment of the invention.

FIG. 8 illustrates a block diagram of an example CCP system in accordance with an embodiment of the invention. The CCP system of FIG. 8 may be used to implement the schematic timing diagrams to perform any of the embodiment methods as described herein, such as the schematic timing diagram of FIG. 1A, for example. Furthermore, the CCP system of FIG. 8 may be used to perform any of the embodiment methods as described herein, such as the methods of FIGS. 9-11, for example. Similarly labeled elements may be as previously described.

Referring to FIG. 8, a CCP system 801 includes a target substrate 804 disposed in a plasma processing chamber 884 inside which a CCP plasma 886 is generated between an SP electrode 888 and a BP electrode 889. The target substrate 804 may be electrically coupled to the BP electrode 889. For example, the BP electrode 889 may be a substrate holder and is an electrostatic chuck in one embodiment.

SP is provided to the SP electrode 888 via an SP control path 887 while BP is provided to the BP electrode 889 via a BP control path 897. SP provided to the SP electrode 888 generates the CCP plasma 886 within the plasma processing chamber 884. The SP control path 887 includes an SP function generator 885 coupled to the SP electrode 888 through an SP impedance matching network 883. The SP function generator 885 is coupled to an SP pulse modulation circuit 881 which outputs a modulated source signal. The SP function generator 885 superimposes a waveform (e.g. a sinusoidal waveform) onto the modulated source signal to generate SP pulses that are delivered to the SP electrode 888.

Similarly, the BP control path 897 includes an optional BP function generator 895 coupled to the BP electrode 889 through an optional BP impedance matching circuit 893. The BP control path 897 also includes an optional BP pulse modulation circuit 891. The optional BP function generator 895 may be coupled to the optional BP pulse modulation circuit 891 which outputs a modulated source signal. The optional BP function generator 895 may superimpose a waveform (e.g. a sinusoidal waveform) onto the modulated source signal to generate BP pulses that are delivered to the BP electrode 889. Both the SP function generator 885 and the optional BP function generator 895 may include an amplification circuit to allow adjustment of amplitude of SP pulses and BP pulses during different phases of a pulse cycle.

Alternatively, the optional BP function generator 895 and the optional BP impedance matching circuit 893 may be omitted and BP may be directly supplied to the BP electrode 889. Such a configuration may be used with DC power is provided directly to the BP electrode 889. For example, a BP pulse train may be generated at the BP electrode 889 by coupling the optional BP pulse modulation circuit 891 directly to the BP electrode 889.

In the specific case where the BP pulses are identical to the SP pulses except for a timing offset the BP control path 897 may use the SP pulse modulation circuit 881 and omit the optional BP pulse modulation circuit 891. However, the optional BP pulse modulation circuit 891 may advantageously enable greater flexibility regarding the pulse width, amplitude, and shape of the BP pulses compared to the SP pulses.

On or more elements described above may be included in controller 880 that controls the timing of the SP pulses and the BP pulses. A pulse modulation timing circuit 882 is also included in the controller 880. The pulse modulation timing circuit 882 may accept an input from the SP pulse modulation circuit 881 and adjust the timing of the signal modulated by the optional BP pulse modulation circuit 891. The pulse modulation timing circuit 882 may also control the timing of both the SP pulse modulation circuit 881 and the optional BP pulse modulation circuit 891.

Although the CCP system 801 is illustrated as providing SP at a top electrode and BP at a bottom electrode, this does not have to be the case. For example, in an alternate configuration, the CCP system 801 may provide both SP and BP at the bottom electrode while the top electrode operates as a counter electrode.

Figure 9:
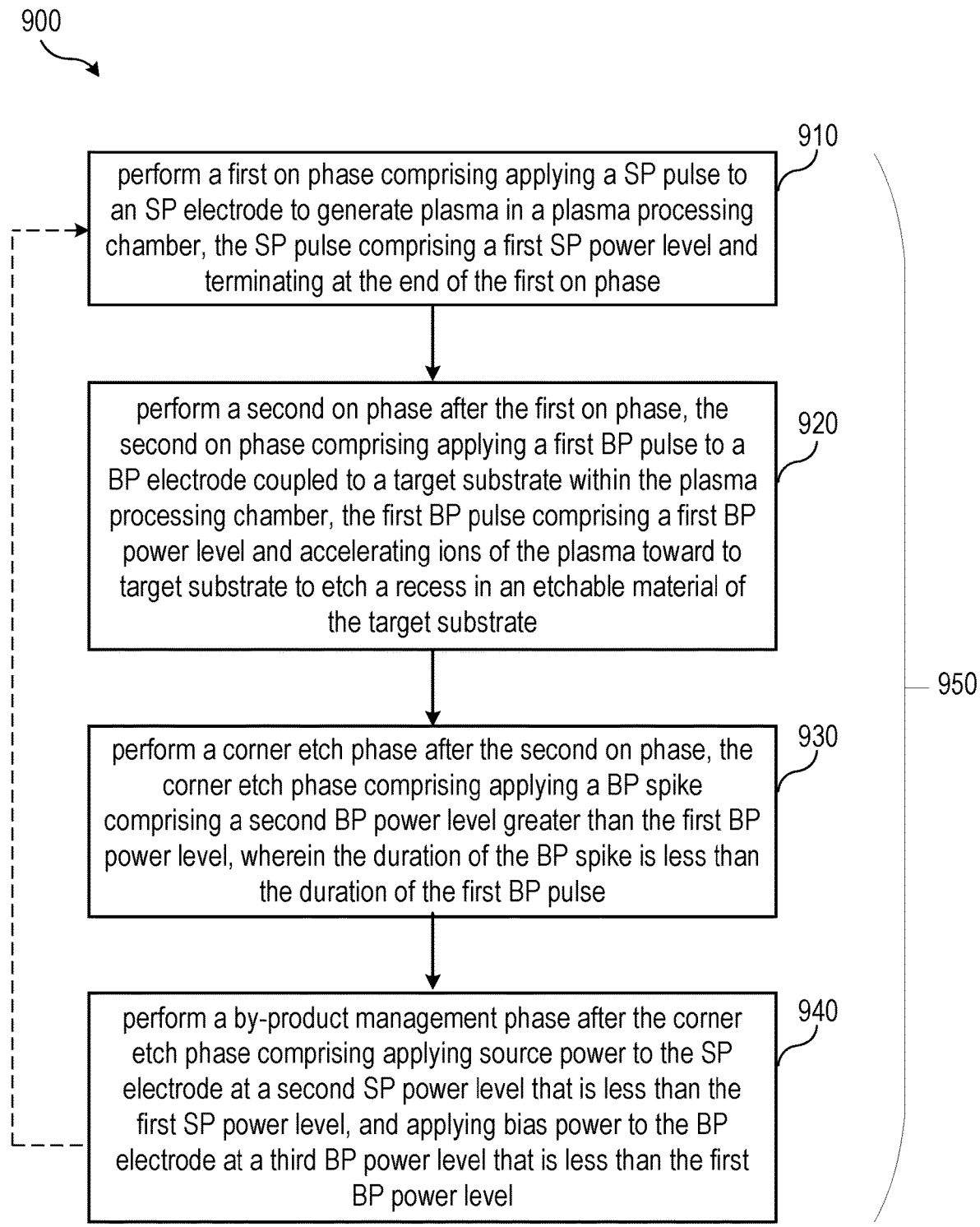
FIG. 9 illustrates an example method of plasma processing in accordance with an embodiment of the invention.

FIG. 9 illustrates an example method of plasma processing in accordance with an embodiment of the invention. The method of FIG. 9 may be combined with other methods and performed using the systems and apparatuses as described herein. For example, the method of FIG. 9 may be combined with any of the embodiments of FIGS. 1A-8. Although shown in a logical order, the arrangement and numbering of the steps of FIG. 9 are not intended to be limited. The method steps of FIG. 9 may be performed in any suitable order or concurrently with one another as may be apparent to a person of skill in the art.

Referring to FIG. 9, step 910 of a method 900 of plasma processing includes performing a first on phase comprising applying a SP pulse to an SP electrode to generate plasma in a plasma processing chamber, the SP pulse comprising a first SP power level and terminating at the end of the first on phase. Step 920 includes performing a second on phase after the first on phase, the second on phase comprising applying a first BP pulse to a BP electrode coupled to a target substrate within the plasma processing chamber, the first BP pulse comprising a first BP power level and accelerating ions of the plasma toward to target substrate to etch a recess in an etchable material of the target substrate.

A corner etch phase is performed after the second on phase in step 930, the corner etch phase comprising applying a BP spike comprising a second BP power level greater than the first BP power level. The duration of the BP spike is less than the duration of the first BP pulse. Step 940 includes performing a by-product management phase after the corner etch phase, the by-product management phase comprising applying source power to the SP electrode at a second SP power level that is less than the first SP power level, and applying bias power to the BP electrode at a third BP power level that is less than the first BP power level. Steps 910, 920, 930, and 940 may be performed cyclically as part of a cycle 950.

Figure 10:
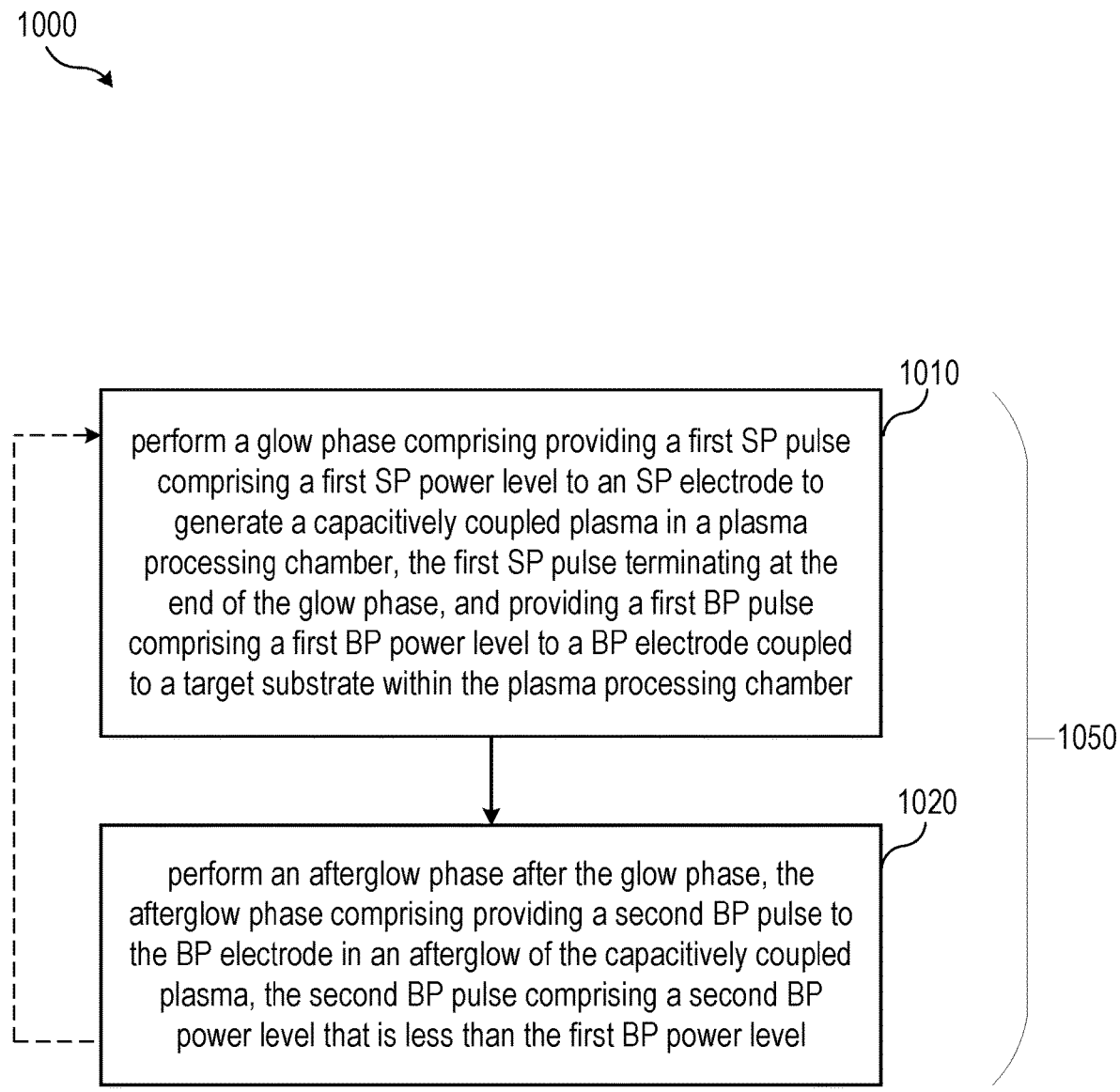
FIG. 10 illustrates another example method of plasma processing in accordance with an embodiment of the invention.

FIG. 10 illustrates another example method of plasma processing in accordance with an embodiment of the invention. The method of FIG. 10 may be combined with other methods and performed using the systems and apparatuses as described herein. For example, the method of FIG. 10 may be combined with any of the embodiments of FIGS. 1A-8. Additionally, the method of FIG. 10 may be combined with other methods such as the method of FIG. 9, for example. Although shown in a logical order, the arrangement and numbering of the steps of FIG. 10 are not intended to be limited. The method steps of FIG. 10 may be performed in any suitable order or concurrently with one another as may be apparent to a person of skill in the art.

Referring to FIG. 10, step 1010 of a method 1000 includes performing a glow phase comprising providing a first SP pulse comprising a first SP power level to an SP electrode to generate a capacitively coupled plasma in a plasma processing chamber, the first SP pulse terminating at the end of the glow phase, and providing a first BP pulse comprising a first BP power level to a BP electrode coupled to a target substrate within the plasma processing chamber. Step 1020 includes performing an afterglow phase after the glow phase, the afterglow phase comprising providing a second BP pulse to the BP electrode in an afterglow of the capacitively coupled plasma, the second BP pulse comprising a second BP power level that is less than the first BP power level. Steps 1010 and 1020 may be performed cyclically as part of a cycle 1050.

Example embodiments of the invention are summarized here. Other embodiments can also be understood from the entirety of the specification as well as the claims filed herein.

Example 1. A method of plasma etching, the method including: performing a first on phase including applying a SP pulse to an SP electrode to generate plasma in a plasma processing chamber, the SP pulse including a first SP power level and terminating at the end of the first on phase; performing a second on phase after the first on phase, the second on phase including applying a first BP pulse to a BP electrode coupled to a target substrate within the plasma processing chamber, the first BP pulse including a first BP power level and accelerating ions of the plasma toward to target substrate to etch a recess in an etchable material of the target substrate; performing a corner etch phase after the second on phase, the corner etch phase including applying a BP spike including a second BP power level greater than the first BP power level, where the duration of the BP spike is less than the duration of the first BP pulse; and performing a by-product management phase after the corner etch phase, the by-product management phase including applying source power to the SP electrode at a second SP power level that is less than the first SP power level, and applying bias power to the BP electrode at a third BP power level that is less than the first BP power level.

Example 2. The method of example 1, further including: cyclically performing the first on phase, the second on phase, the corner etch phase, and the by-product management phase.

Example 3. The method of one of examples 1 and 2, where the first on phase further includes: applying a second BP pulse concurrently with the SP pulse, the second BP pulse including a fourth BP power level greater than the first BP power level.

Example 4. The method of example 3, where applying the second BP pulse includes decreasing the fourth BP power level to the first BP power level prior to the termination of the SP pulse.

Example 5. The method of one of examples 1 to 4, further including: performing an off phase after the first on phase and before the second on phase, the off phase including applying no bias power to the BP electrode.

Example 6. The method of one of examples 1 to 5, where both the second SP power level and the third BP power level are greater than zero.

Example 7. A method of plasma processing, the method including: performing a glow phase including providing a first SP pulse including a first SP power level to an SP electrode to generate a capacitively coupled plasma in a plasma processing chamber, the first SP pulse terminating at the end of the glow phase, and providing a first BP pulse including a first BP power level to a BP electrode coupled to a target substrate within the plasma processing chamber; and performing an afterglow phase after the glow phase, the afterglow phase including providing a second BP pulse to the BP electrode in an afterglow of the capacitively coupled plasma, the second BP pulse including a second BP power level that is less than the first BP power level.

Example 8. The method of example 7, further including: cyclically performing the glow phase and the afterglow phase.

Example 9. The method of one of examples 7 and 8, where the SP includes high frequency power greater than about 27 MHz, and where the BP includes low frequency power between about 100 kHz and about 13 MHz.

Example 10. The method of one of examples 7 to 9, where the afterglow phase further includes: providing a second SP pulse to the SP electrode, the second SP pulse including a second SP power level that is less than the first SP power level.

Example 11. The method of one of examples 7 to 10, further including: performing a first off phase after the glow phase, the first off phase including applying no bias power to the BP electrode to delay providing the second BP pulse.

Example 12. The method of example 11, where the first off phase further includes applying a second SP pulse to the SP electrode, the second SP pulse including a second SP power level that is less than the first SP power level.

Example 13. The method of one of examples 11 and 12, further including: performing a second off phase after the afterglow phase, the second off phase including applying to no bias power to the BP electrode to delay a subsequent glow phase.

Example 14. The method of example 13, where the first off phase, the afterglow phase, and the second off phase further include applying a second SP pulse to the SP electrode, the second SP pulse including a second SP power level that is less than the first SP power level.

Example 15. The method of one of examples 7 to 14, where the afterglow phase further includes providing a BP spike to the BP electrode after the second BP pulse, the BP spike including a third BP power level greater than the second BP power level, where the duration of the BP spike is less that the duration of the second BP pulse.

Example 16. The method of one of examples 7 to 15, where the second BP pulse is a BP pulse train including a plurality of BP spikes, where the BP is direct current (DC) power.

Example 17. A method of plasma processing, the method including cyclically performing the following steps: concurrently applying SP including a first SP power level to an SP electrode to generate a capacitively coupled plasma in a plasma processing chamber, and BP including a first BP power level to a BP electrode coupled to a target substrate within the plasma processing chamber; reducing the SP from the first SP power level to a second SP power level; reducing the BP from the first BP power level to a second BP power level; and reducing the BP from the second BP power level to a third BP power level.

Example 18. The method of example 17, further including: decreasing the BP from the first BP power level the second BP power level before reducing the SP from the first SP power level to the second SP power level.

Example 19. The method of one of examples 17 and 18, where reducing the BP from the first BP power level to the second BP power level includes: reducing the BP from the first BP power level to zero; applying no bias power to the BP electrode for a nonzero duration; and increasing the BP from zero to the second BP power level.

Example 20. The method of one of examples 17 to 19, further including: after reducing the BP from the first BP power level the second BP power level and before reducing the BP from the second BP power level to the third BP power level, increasing the BP from the second BP power level to a fourth BP power level; and decreasing the BP from the fourth BP power level to the third BP power level.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of plasma etching, the method comprising:
   performing a first on phase comprising applying a source power (SP) pulse to an SP electrode to generate plasma in a plasma processing chamber, the SP pulse comprising a first SP power level during the first on phase;
   performing a second on phase after the first on phase, the second on phase comprising applying a first bias power (BP) pulse to a BP electrode coupled to a target substrate within the plasma processing chamber, the first BP pulse comprising a first BP power level and accelerating ions of the plasma toward the target substrate to etch a recess in an etchable material of the target substrate;
   performing a corner etch phase after the second on phase, the corner etch phase comprising applying a BP spike comprising a second BP power level greater than the first BP power level, wherein the duration of the BP spike is less than the duration of the first BP pulse; and
   performing a by-product management phase after the corner etch phase, the by-product management phase comprising
      applying source power to the SP electrode at a second SP power level that is less than the first SP power level, and
      applying bias power to the BP electrode at a third BP power level that is less than the first BP power level.

2. The method of claim 1, further comprising:
   cyclically performing a cycle comprising the first on phase, the second on phase, the corner etch phase, and the by-product management phase.

3. The method of claim 1, further comprising:
   performing an off phase after the first on phase and before the second on phase, the off phase comprising applying no bias power to the BP electrode.

4. The method of claim 1, wherein both the second SP power level and the third BP power level are greater than zero.

5. The method of claim 1, wherein the first on phase further comprises:
   applying a second BP pulse concurrently with the SP pulse, the second BP pulse comprising a fourth BP power level greater than the first BP power level.

6. The method of claim 5, wherein applying the second BP pulse comprises decreasing the fourth BP power level to the first BP power level after the duration of the first on phase.

7. A method of plasma processing, the method comprising cyclically performing a cycle comprising the following steps:
   performing a glow phase comprising
      providing a first source power (SP) pulse comprising a first SP power level to an SP electrode to generate a capacitively coupled plasma in a plasma processing chamber, the first SP pulse terminating at the end of the glow phase, and
      providing a first bias power (BP) pulse comprising a first BP power level to a BP electrode coupled to a target substrate within the plasma processing chamber; and
   performing an afterglow phase after the glow phase, the afterglow phase comprising providing a second BP pulse to the BP electrode in an afterglow of the capacitively coupled plasma, the second BP pulse comprising a second BP power level that is less than the first BP power level.

8. The method of claim 7, wherein the SP comprises high frequency power greater than about 27 MHz, and wherein the BP comprises low frequency power between about 100 kHz and about 13 MHz.

9. The method of claim 7, wherein the afterglow phase further comprises:
providing a second SP pulse to the SP electrode, the second SP pulse comprising a second SP power level that is less than the first SP power level.

10. The method of claim 7, wherein the afterglow phase further comprises providing a BP spike to the BP electrode after the second BP pulse, the BP spike comprising a third BP power level greater than the second BP power level, wherein the duration of the BP spike is less that the duration of the second BP pulse.

11. The method of claim 7, wherein the second BP pulse is a BP pulse train comprising a plurality of BP spikes, wherein the BP is direct current (DC) power, and the first BP power level is zero.

12. The method of claim 7, wherein the cycle further comprises:
performing a first off phase after the glow phase when the first BP power level is zero, the first off phase comprising applying no bias power to the BP electrode prior to performing the afterglow phase.

13. The method of claim 12, wherein the cycle further comprises:
performing a second off phase after the afterglow phase, the second off phase comprising applying no bias power to the BP electrode prior to performing a subsequent glow phase.

14. The method of claim 13, wherein the first off phase, the afterglow phase, and the second off phase further comprise applying a second SP pulse to the SP electrode, the second SP pulse comprising a second SP power level that is less than the first SP power level.

15. The method of claim 12, wherein the first off phase further comprises applying a second SP pulse to the SP electrode, the second SP pulse comprising a second SP power level that is less than the first SP power level.

16. The method of claim 15, wherein the afterglow phase further comprises
providing a BP spike to the BP electrode after the second BP pulse, the BP spike comprising a third BP power level greater than the second BP power level, and
providing a third SP pulse to the SP electrode during the BP spike, the third SP pulse comprising a third SP power level less than the second SP power level,
wherein the duration of the BP spike is less than the duration of the second BP pulse.

17. A method of plasma processing, the method comprising cyclically performing a cycle comprising the following steps:
concurrently applying source power (SP) comprising a first SP power level to an SP electrode to generate a capacitively coupled plasma in a plasma processing chamber, and bias power (BP) comprising a first BP power level to a BP electrode coupled to a target substrate within the plasma processing chamber;
reducing the SP from the first SP power level to a second SP power level;
reducing the BP from the first BP power level to a second BP power level; and
reducing the BP from the second BP power level to a third BP power level.

18. The method of claim 17, wherein the cycle further comprises:
decreasing the BP from the first BP power level the second BP power level before reducing the SP from the first SP power level to the second SP power level.

19. The method of claim 17, wherein reducing the BP from the first BP power level to the second BP power level comprises:
reducing the BP from the first BP power level to zero;
applying no bias power to the BP electrode for a nonzero duration; and
increasing the BP from zero to the second BP power level.

20. The method of claim 17, wherein the cycle further comprises:
after reducing the BP from the first BP power level the second BP power level and before reducing the BP from the second BP power level to the third BP power level,
increasing the BP from the second BP power level to a fourth BP power level; and
decreasing the BP from the fourth BP power level to the third BP power level.

* * * * *